United States Patent [19]

Mitchell

[11] Patent Number: 4,482,780

[45] Date of Patent: Nov. 13, 1984

[54] SOLAR CELLS WITH LOW COST SUBSTRATES AND PROCESS OF MAKING SAME

[75] Inventor: Kim W. Mitchell, Indian Hills, Colo.

[73] Assignee: The United States of America as represented by the United States Department of Energy, Washington, D.C.

[21] Appl. No.: 445,772

[22] Filed: Nov. 30, 1982

[51] Int. Cl.$^3$ .................... H01L 31/06; H01L 31/18
[52] U.S. Cl. .................................... 136/258; 29/572; 148/1.5; 357/30; 357/59; 427/74; 427/86
[58] Field of Search ............... 136/258 PC; 357/30, 357/59; 29/572; 148/1.5; 427/74, 86

[56] References Cited

U.S. PATENT DOCUMENTS 4,053,326 10/1977 Forrat .................................. 136/256

OTHER PUBLICATIONS

N. Romeo, *J. Crystal Growth*, vol. 52, pp. 692–698, (1981).
F. Krajenbrink et al., "Large Grains of InP and CdTe on Recrystallized CdS Substrates", *J. Appl. Phys.*, vol. 52, pp. 1524–1527, (1981).

*Primary Examiner*—Aaron Weisstuch
*Attorney, Agent, or Firm*—Jeannette M. Walder; Walter L. Rees; Michael F. Esposito

[57] ABSTRACT

A solar cell having a substrate and an intermediate recrystallized film and a semiconductor material capable of absorbing light with the substrate being selected from one of a synthetic organic resin, graphite, glass and a crystalline material having a grain size less than about 1 micron$^2$. The intermediate recrystallized film has a grain size in the range of from about 10 microns$^2$ to about 10,000 microns$^2$ and a lattice mismatch with the semiconductor material not greater than about 4%. The semiconductor material has a grain size not less than about 10 microns$^2$. An anti-reflective layer and electrical contact means are provided. Also disclosed is a subcombination of substrate, intermediate recrystallized film and semiconductor material. Also, methods of formulating the solar cell and subcombination are disclosed.

15 Claims, 2 Drawing Figures

SOLAR CELLS WITH LOW COST SUBSTRATES AND PROCESS OF MAKING SAME

CONTRACTUAL ORIGIN OF THE INVENTION

The invention described herein was made in the course of, or under, a contract with the UNITED STATES DEPARTMENT OF ENERGY.

BACKGROUND OF THE INVENTION

Photovoltaic devices, i.e., solar cells, are capable of converting solar radiation into usable electrical energy. The energy conversion occurs as the result of what is known as the photovoltaic effect. Solar radiation impinging on a solar cell and absorbed by an active region of semiconductor material generates electrons and holes. Electrons and holes are separated by a built-in electric field in the solar cell, such as a rectifying junction. The separation of electrons and holes by the rectifying junction results in the generation of an electric current known as the photocurrent and a voltage known as the photovoltage. The electrons flow toward the region of semiconductor material having N-type conductivity, and the holes flow toward a region of semiconductor material of opposite conductivity or a metal layer.

Significant reduction in the cost of solar cells can be achieved by reducing the materials and manufacturing cost and by improving the photovoltaic conversion efficiency. Some progress has been made in the identification of several promising thin film solar cells such as CdTe, $Zn_3P_2$, $Cu_2Se$ and amorphous silicon. Unfortunately, the cell efficiencies achieved in thin film devices are significantly lower than those obtained for single crystal cells usually because of the lower quality film epitaxy produced on low cost foreign substrates. Thus, heretofore a trade-off has existed in the selection of solar cell substrates with either amorphous or small grain materials such as glass, ceramic or metal sheets which have a low cost but hinder the growth of high quality solar cells or large grain or single crystal material which allow the growth of high quality solar cell layers but are higher in cost.

The subject invention avoids the above dilemma by enabling the use of low cost substrate material such as synthetic organic resins, graphite, glass, abundant metals or other crystalline materials having grain sizes not greater than about 1 micron by depositing a low melting point crystalline film on the substrate and recrystallizing the film to form a large grain material on which can be grown the solar cell or semiconductor material.

SUMMARY OF THE INVENTION

A principal object of the present invention is to provide a solar cell wherein an inexpensive substrate material may be used to support semiconductor material having a grain size not less than about 10 microns$^2$.

An important object of the present invention is to provide a solar cell comprising a substrate and an intermediate crystalline film and a semiconductor material capable of absorbing light, the intermediate crystalline film having a suitable lattice match with the semiconductor material and a grain size not less than about 10 microns$^2$, the semiconductor material contacting the intermediate crystalline film and having a grain size not less than about 10 microns$^2$, and electrical contact means electrically connected to the intermediate crystalline film and to the semiconductor material.

Yet another object of the present invention is to provide a solar cell comprising a substrate and an intermediate recrystallized film and a semiconductor material capable of absorbing light, the intermediate recrystallized film having a suitable lattice match with the semiconductor material and a grain size not less than about 10 microns$^2$, the semiconductor material contacting the intermediate recrystallized film and having a grain size not less than about 10 microns$^2$, and electrical contact means electrically connected to the intermediate crystalline film and to the semiconductor material.

Yet another object of the present invention is to provide a solar cell comprising a substrate and an intermediate recrystallized film and a semiconductor material capable of absorbing light, the substrate being selected from the group consisting of a synthetic organic resin, graphite, glass and a crystalline material having a grain size less than about 1 micron$^2$, the intermediate recrystallized film having a grain size in the range of from about 10 microns$^2$ to about 10,000 microns$^2$ and a lattice mismatch with the semiconductor material not greater than about 4%, the semiconductor material contacting the intermediate recrystallized film and having a grain size not less than about 10 microns$^2$, an anti-reflective layer having a thickness of less than about 1 micron on the semiconductor material, and electrical contact means electrically connected to the intermediate crystalline film and to the semiconductor material.

A still further object of the present invention is to provide a method of making a solar cell comprising providing a substrate, providing a crystalline film having a grain size not less than about 10 microns$^2$ on the substrate, depositing a semiconductor material capable of absorbing light on the crystalline film so that the semiconductor material has a grain size not less than about 10 microns$^2$, and providing electrical contact means electrically connected to the crystalline film and to the semiconductor material.

Yet another object of the present invention is to provide a method of making a solar cell comprising providing a substrate, depositing a crystalline film having a thickness not less than about 0.01 micron on the substrate, heating the crystalline film to a temperature not less than about the melting point temperature of the crystalline film to cause the film to recrystallize with a grain size not less than about 10 microns$^2$, depositing a semiconductor material on the recrystallized film so that the semiconductor material has a grain size not less than about 10 microns$^2$, and providing electrical contact means electrically connected to the crystalline film and to the semiconductor material.

A still further object of the present invention is to provide a method of making a solar cell comprising providing a substrate, depositing a crystalline film having a thickness in the range of from about 0.01 micron to about 1 micron on the substrate, providing means for heating the crystalline film to a temperature not less than about the melting point temperature of the crystalline film, providing relative movement between the heating means and the film to heat the crystalline film in zones and thereafter to cool the heated film to provide a recrystallized film with a grain size not less than about 10 microns$^2$, depositing a semiconductor material capable of absorbing light on the recrystallized film so that the semiconductor material has a grain size not less than about 10 microns$^2$, and providing electrical contact means electrically connected to the crystalline film and to the semiconductor material.

Yet another object of the present invention is to provide a substrate having on at least one surface thereof a crystalline film with a grain size not less than about 10 microns$^2$, and a semiconductor material covering the crystalline film and having a grain size not less than about 10 microns$^2$.

A still further object of the present invention is to provide a substrate having on at least one surface thereof a recrystallized film having a thickness not less than about 0.01 micron with a grain size not less than about 10 microns$^2$, and a semiconductor material covering the recrystallized film and having a grain size not less than about 10 microns$^2$.

A final object of the present invention is to provide a substrate selected from the class consisting of a synthetic organic resin, graphite, glass and a crystalline material having a grain size less than about 1 micron$^2$, a recrystallized film on the substrate having a thickness in the range of from about 0.01 micron to about 1 micron and a grain size not less than about 10 microns$^2$, and a semiconductor material covering the recrystallized film and having a grain size not less than about 10 microns$^2$.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

DESCRIPTION OF THE FIGURES

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DETAILED DESCRIPTION OF THE INVENTION

Figure 1:
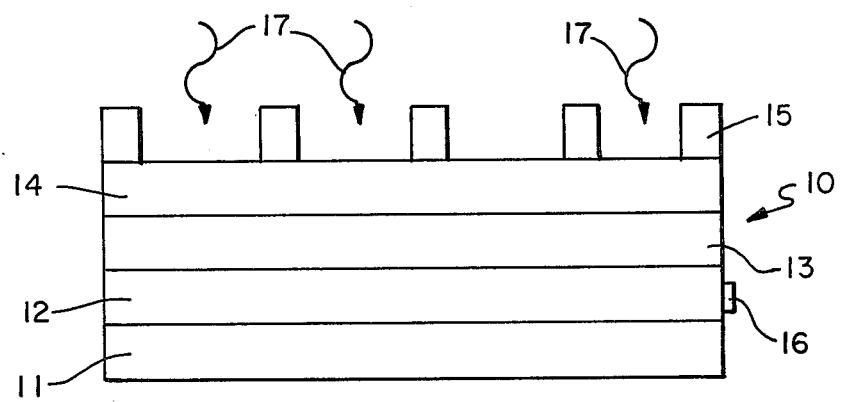
FIG. 1 is a schematic illustration of a solar cell incorporating the features of the present invention.

Referring now to FIG. 1 of the drawings, there is illustrated a solar cell 10 made in accordance with the present invention wherein substrate 11 has on on surface thereof an intermediate recrystallized layer 12 which receives on the other surface thereof a film 13 of a semiconductor material capable of absorbing light. A window or barrier layer 14 is on top of the semiconductor film or layer 13 and an electrical contact grid 15 is provided on top of the window or barrier layer 14. Electrical lead 16 in intimate contact with the intermediate recrystallized layer 12 and the electrical grids 15 serve as electrical leads in electrical contact with the semiconductor layer 13 and barrier layer 14, respectively. Light rays 17 incident the window 14 of the solar cell 10 produce the traditional photovoltaic effect resulting in a photovoltaically generated current and voltage.

Figure 2:
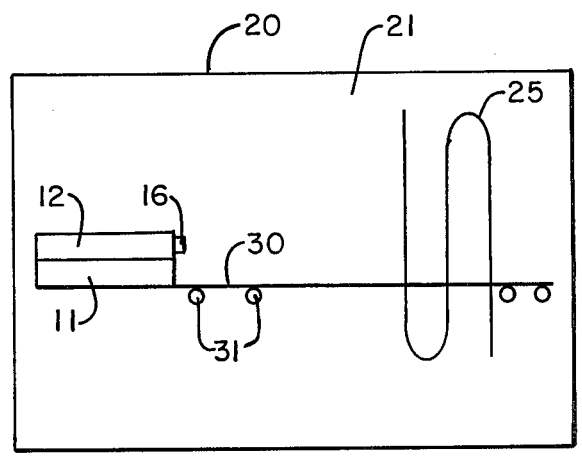
FIG. 2 is a schematic illustration of apparatus used for fabricating the solar cell of the present invention.

Referring now to FIG. 2, there is illustrated a schematic representation of a container 20 in which is present a controlled atmosphere 21 such as a forming gas of nitrogen and hydrogen. The substrate 11 having the intermediate film 12 deposited thereon is moved relative to an electrical heater represented by coil mechanism 25 so as to zone melt the intermediate film 12 thereby causing recrystallization of same, thereby providing grain sizes in the range of from about 10 micron$^2$ to about 10,000 micron$^2$. The relative movement between the heating mechanism 25, which may be a traditional resistance heater coil or an induction coil, and the substrate 11 with the intermediate film 12 thereon may be provided by conveyor 30 with the usual conveying rollers 31. Thereafter, the semiconductor layer 13 is deposited on the recrystallized intermediate film 12 by any method known in the art, such as the glow discharge method. Thereafter, the window or barrier layer 14 is deposited by well known means and finally the electrical contact grid 15 is layed down, all as is well known in the art.

The substrate 11 may be any desired material which will withstand the temperatures required to melt and recrystallize the intermediate film 12. Since the intermediate film 12, as hereinafter set forth, will be preferably limited to materials having a melting point not substantially greater than about 700° C., the substrate 11, should be selected from a material which can withstand 700° C. temperatures without serious degradation. Preferred materials are inexpensive substrates such as certain high temperature synthetic organic resins, glass, graphite or low cost sheet metal or foil including inexpensive iron based materials. If the substrate 11 is made from an electrical conductor such as from steel or the like, then the electrical contact 16 may be eliminated, with the substrate 11 serving as a contact which is electrically connected to the intermediate film 12. If the substrate 11 is not a good electrical conductor, then the electrical contact 16, as illustrated, may be provided.

The intermediate film 12 may be deposited on the substrate 11 by any means well known in the art, such as by plating bath, chemical vapor deposition, vacuum evaporation, electro-deposition, sputtering or the like. The intermediate film 12 may be any low melting point material, either a semiconductor material or a metallic material which is capable of being recrystallized to provide grain sizes of not less than about 10 micron$^2$ and up to about 10,000 micron$^2$ with the preferred grain size being not less than about 50 micron$^2$. It is understood that larger grain size is desirable in the production of a solar cell 10 and grain sizes of from about 1000 micron$^2$ to about 10,000 micron$^2$ are preferred.

Table 1 sets forth a series of low melting point metals which may be useful either alone or in alloy combinations as the intermediate film 12.

TABLE 1

| Element | Melting Point | Density (g/cc) | Crystal Structure |
|---|---|---|---|
| Al | 660 | 2.70 | Face Center Cube |
| Sb | 630.5 | 6.68 | Rhombehedron |
| Bi | 271 | 9.80 | Rhombohedron |
| Cd* | 321 | 8.65 | Hexagonal Close Pack |
| In | 156.2 | 7.31 | Face Center Tetragonal |
| Pb | 327.3 | 11.39 | Face Center Cube |
| Se* | 217 | 4.79 | Hexagonal |
| Te | 450 | 6.24 | Hexagonal |
| Sn* | 231 | 7.36 | Tetragonal |
| Zn | 419.5 | 7.13 | Hexagonal Close Pack |

*Other crystal modifications exist Rcf W. Moffatt, G. Pearsall, J. Wolff The Structure and Properties of Materials, Vol. 1 John Wiley & Sons, New York, 1964

The preferred materials are Bi, Cu, In, Se, Te, Sn, Cd, Zn, Sb and alloys thereof. The thickness of the intermediate film 12 should be at least about 0.01 micron so that upon melting the film will not become discontinuous. On the other hand, a thicker film 12 results in material waste and hence becomes expensive. The preferred thickness of the intermediate film 12 is in the range of from about 0.1 to about 1 micron, it being understood that the upper limit is one of economic consideration.

In order to provide the crystal size necessary to obtain the benefits of the present invention, it is necessary to zone melt the intermediate film 12 after it has been deposited on the substrate 11 to recrystallize the film. Preferably, the zone melting takes place at a temperature in the range of from about the melting point of the intermediate film 12 to a temperature no more than about 20° C. above the melting point and preferably to a temperature no greater than about 10° C. above the melting point. In order to prevent thermal shock to the substrate 11 and intermediate film 12, it is preferred to heat the combination of substrate 11 and intermediate film 12 to a temperature of about 20° C. below the melting point of the intermediate film prior to the zone melting thereof to compensate for any difference in thermal expansion coefficients between the intermediate film 12 and the substrate 11. The rate of relative movement between the heating mechanism 25 and the combination of the substrate 11 and intermediate film 12 depends on the thickness of the intermediate film 12. A thicker film requires a longer heating time and conversely a thinner film requires less. It is preferred that the relative movement between the heater 25 and the combination of the substrate 11 and intermediate film 12 be at least about 10 cm per minute, which is provided by a conveying mechanism 30, all as is well known in the art.

After the intermediate film 12 has been recrystallized as aforesaid, the semiconductor or solar material 13 is deposited on the thin film 12 by means well known in the art such as the glow discharge method. Depending on the end use of the product, the layer 13 of semiconductor material may be of any thickness but if the end use is a solar cell 10, then the semiconductor material should have a thickness in the range of from about 2 microns to about 5 microns. The semiconductor material 13 should be selected to provide maximum epitaxy between the semiconductor material 13 and the intermediate film 12. Possible semiconductor materials include $CuInSe_2$, CdTe, $Zn_3P_2$, $Cu_2Se$, CdSe and other materials are also useful such as InSb. In fact, any semiconductor material which is suitable for the end purpose desired is acceptable provided that the intermediate film 12 and the semiconductor material 13 are selected to provide a suitable lattice match. The lattice match is defined as the atom spacing of the material of one layer divided by the atom spacing of the material of the other layer and the resultant number is called the lattice mismatch and should not exceed 4%. The preferred lattice mismatch should not exceed about 1%, but the subject invention does allow for a larger lattice mismatch than heretofore possible. By limiting the lattice mismatch between the intermediate film 12 and the semiconductor material 13, good epitaxy is provided and significantly larger grain size results in the semiconductor material when it is deposited on the recrystallized intermediate film than heretofore possible.

In the past, when semiconductor material was deposited on substrates such as tungsten films and the like having grain sizes less than about 0.1 microns, the grain size of the semiconductor material was so small as to be unacceptable for solar cell material. On the other hand, it has been found that depositing semiconductor material on recrystallized intermediate films 12 having grain sizes in excess of 10 microns and preferably in the range of from between about 50 microns to about 10,000 microns, results in the semiconductor material having a grain size significantly larger than heretofore obtainable with low cost, small grain substrates. For instance, the grain size of graphite or steel is less than about 0.1 micron$^2$, however such substrate materials are perfectly acceptable when an intermediate film such as tin or tellurium or any of the materials listed in Table 1 are deposited on the substrate and then recrystallized as aforesaid.

After the semiconductor material 13 is deposited on the recrystallized film 12, an annealing process is provided wherein the combination of the substrate 11, the intermediate film 12, and the semiconductor material 13 is heated to a temperature in the range of from about 150° C. to about 200° C. to passivate any oxide which may have formed on the surface of the semiconductor material 13. This annealing step provides for improved electrical contact properties and diffuses any dopants which were deposited with the semiconductor material 13. Thereafter, the window or anti-reflective layer material 14 such as art recognized materials like cadmium sulfide, zinc-cadmium sulfide, tin oxide, indium oxide, a combination of tin and indium oxide, silicon monoxide, titanium dioxide or other suitable material is deposited on the semiconductor material 13 thereafter an electrode grid 15 is layed down in a well known manner to complete the solar cell 10.

While the present invention has been described in context of the solar cell 10, it will be understood that the combination of the substrate 11, the intermediate film 12 and the semiconductor material 13 is in and of itself a useful subcombination which because of the low cost nature of the substrate 11 is a significant improvement in the art. The disclosed process of making the solar cell as well as the subcombination of the substrate 11, the intermediate film 12 and the semiconductor material 13 is important because it permits rapid production of low cost material having good epitaxy and significantly improved grain size.

While there has been provided what at present is considered to be the preferred embodiment of the present invention, it will be understood that various modifications and alterations may be made therein without departing from the true scope and spirit of the present invention, and it is intended to cover in the claims hereto all such variations and modifications.

The embodiments of the invention in which an exclusive property or privilege is claimed are defined as follows:

1. A solar cell comprising a substrate,
    an intermediate crystalline film deposited on the substrate and recrystallized by zone melting the crystalline film at a temperature of at least about the melting point temperature of the crystalline film to cause the film to recrystallize with a grain size not less than about 1000 microns$^2$, and
    a semiconductor material capable of absorbing light deposited on said recrystallized intermediate film,
    said recrystallized intermediate film having a suitable lattice match with said semiconductor material, said semiconductor material having a grain size not less than about 10 microns$^2$, and electrical contact means electrically connected to said recrystallized intermediate film and to said semiconductor material.

2. The solar cell of claim 2, wherein said substrate is selected from the group consisting of a synthetic organic resin, graphite, glass and an iron based metal.

3. The solar cell of claim 1, wherein said intermediate crystalline film is selected from a semiconductor material or a metallic material having a melting point not greater than about 700° C.

4. The solar cell of claim 1, wherein said intermediate crystalline film is selected from the group consisting of aluminum, tin, lead, bismith, copper, indium, selenium, cadmium, tellurium, zinc, antimony, and alloys thereof.

5. The solar cell of claim 1, wherein the lattice mismatch between said intermediate crystalline film and said semiconductor material is not greater than about 4%.

6. The solar cell of claim 1, wherein the lattice mismatch between said crystalline film and said semiconductor material is not greater than about 1%.

7. The solar cell of claim 1, wherein the grain size of said recrystallized intermediate film is in the range of from about 1000 microns$^2$ to about 10,000 microns$^2$.

8. A solar cell comprising a substrate, an intermediate crystalline film deposited on the substrate and recrystallized by zone melting the crystalline film at a temperature in the range of from about the melting point of the intermediate film to a temperature no more than about 20° C. above the melting point, to cause the film to recrystallize with a grain size in the range of from about 1000 microns$^2$ to about 10,000 microns$^2$, and a semiconductor material capable of absorbing light deposited on said recrystallized intermediate film, said substrate being selected from the group consisting of a synthetic organic resin, graphite, glass and a crystalline material having a grain size less than about 1 micron$^2$, said recrystallized intermediate film having a lattice mismatch with said semiconductor material not greater than 4%, said semiconductor material having a grain size not less than about 10 microns$^2$, an anti-relfective layer having a thickness of less than about 1 micron on said semiconductor material, and electrical contact means electrically connected to said recrystallized intermediate film and to said semiconductor material.

9. The solar cell of claim 8, wherein said intermediate crystalline film is selected from the group consisting of aluminum, tin, lead, bismith, copper, indium, selenium, cadmium, tellurium, zinc, antimony, and alloys thereof.

10. The solar cell of claim 8, wherein said anti-reflective layer is selected from the class consisting of indium oxide, tin oxide, indium-tin oxide, cadmium sulfide, silicon mono-oxide and titanium dioxide.

11. The solar cell of claim 8 wherein said semiconductor material has a thickness in the range of from about 2 microns to about 5 microns.

12. A method of making a solar cell comprising:

providing a substrate, depositing a crystalline film on said substrate, recrystallizing said crystalline film by zone melting said crystalline film at a temperature of at least about the melting point temperature of said crystalline film to cause said crystalline film to recrystallize with a grain size not less than about 1000 microns$^2$, depositing a semiconductor material capable of absorbing light on said recrystallized film so that said semiconductor material has a grain size not less than about 10 microns$^2$, and providing electrical contact means electrically connected to said recrystallized film and to said semiconductor material.

13. The method of claim 12 wherein said crystalline film is recrystallized with a grain size of from about 1000 microns$^2$ to about 10,000 microns$^2$.

14. The method of claim 12 wherein said zone melting occurs in a range of from about the melting point of said crystalline film to no more than about 20° C. above the melting point.

15. The method of claim 12 further comprising preheating said substrate and said crystalline film to a temperature about 20° C. below the melting point of said crystalline film prior to zone melting said crystalline film.

* * * * *